United States Patent
Kuriyama et al.

(10) Patent No.: US 7,183,127 B2
(45) Date of Patent: Feb. 27, 2007

(54) METHOD OF MANUFACTURING A SEMICONDUCTOR DEVICE

(75) Inventors: Akira Kuriyama, Kanagawa (JP); Hirokatsu Miyata, Kanagawa (JP); Albrecht Otto, Kanagawa (JP); Miki Ogawa, Kanagawa (JP); Hiroshi Okura, Kanagawa (JP); Kazuhiko Fukutani, Kanagawa (JP); Tohru Den, Kanagawa (JP)

(73) Assignee: Canon Kabushiki Kasha, Tokyo (JP)

( * ) Notice: Subject to any disclaimer, the term of this patent is extended or adjusted under 35 U.S.C. 154(b) by 417 days.

(21) Appl. No.: 10/735,062

(22) Filed: Dec. 11, 2003

(65) Prior Publication Data

US 2004/0157354 A1    Aug. 12, 2004

(30) Foreign Application Priority Data

Dec. 13, 2002    (JP)    .............................. 2002-363134

(51) Int. Cl.
*H01L 21/00* (2006.01)
(52) U.S. Cl. .......................................... 438/34; 438/73
(58) Field of Classification Search .................. 257/88, 257/443; 438/34, 73
See application file for complete search history.

(56) References Cited

U.S. PATENT DOCUMENTS

| | | | | |
|---|---|---|---|---|
| 3,890,161 | A * | 6/1975 | Brown, III | ................... 136/212 |
| 4,990,988 | A * | 2/1991 | Lin | .............................. 257/215 |
| 5,581,091 | A * | 12/1996 | Moskovits et al. | ............ 257/9 |
| 6,027,796 | A | 2/2000 | Kondoh | |
| 6,602,620 | B1 | 8/2003 | Kikitsu | |
| 6,946,597 | B2 * | 9/2005 | Sager et al. | ................. 136/263 |
| 2004/0033339 | A1 | 2/2004 | Fukutani | |
| 2004/0043208 | A1 | 3/2004 | Fukutani | |
| 2004/0048092 | A1 | 3/2004 | Yasui | |
| 2004/0144985 | A1 * | 7/2004 | Zhang et al. | .................. 257/79 |
| 2005/0032226 | A1 * | 2/2005 | Natan | ........................... 436/56 |
| 2005/0053773 | A1 | 3/2005 | Fukutani | |

FOREIGN PATENT DOCUMENTS

| | | | |
|---|---|---|---|
| DE | 27 41 954 A1 * | 3/1979 | |
| JP | H09-157062 A | 6/1997 | |
| JP | 10-321834 | 12/1998 | |

(Continued)

OTHER PUBLICATIONS

Boyes, "Understanding the p-n junction", 1990, IOP Publishing, Phys. Educ. vol. 25, pp. 53-59.*

(Continued)

*Primary Examiner*—Evan Pert
(74) *Attorney, Agent, or Firm*—Morgan & Finnegan, LLP

(57) ABSTRACT

A semiconductor device array comprising highly densely arranged nano-size semiconductor devices is prepared by a simple method. The array comprises a porous body having cylinder-shaped pores formed by removing cylinder-shaped regions from a structure that includes a matrix member formed so as to contain silicon or germanium and the cylinder-shaped regions containing aluminum and dispersed in the matrix member, semiconductor regions formed in the pores, each having at least a p-n or p-i-n junction, and a pair or electrodes, arranged respectively on the top and at the bottom of the semiconductor regions. The semiconductor regions and the pair of electrodes form a plurality of semiconductor devices on a substrate.

10 Claims, 7 Drawing Sheets

FOREIGN PATENT DOCUMENTS

| | | |
|---|---|---|
| JP | 2001-162600 | 6/2001 |
| JP | 2001-261376 A | 9/2001 |
| WO | WO 03/069677 | 8/2003 |
| WO | WO 03/078685 | 9/2003 |
| WO | WO 03/078687 | 9/2003 |
| WO | WO 03/078688 | 9/2003 |

OTHER PUBLICATIONS

RC. Furneaux, et al., The formation of controlled-porosity membranes from anodically oxidized aluminum; Nature, vol. 333, p. 147, (1989).

Masuda, "Solid-state Physics", vol. 31, p. 493, (1996).

X. Duan, et al., Indium Phosphide nanowires as building blocks for nanoscale electronic and optoelectronic devices; Nature, vol. 409, p. 66, (2001).

M. Jacobs, et al., Unbalanced magnetron sputtered Si—Al Coatings: plasma conditions and film properties versus sample bias voltage; Surface and Coatings Technology, 116-119 (1999) pp. 735-741.

C. D. Adams, et al., Transition from lateral to transverse phase separation during film co-deposition; Appl. Phys. Lett., 59 (20), Nov. 11, 1991, 2535-2537.

M. Atzmon, et al; Phase separation during film growth; J. Appl. Phys. 72 (2), Jul. 15, 1992, 442-446.

C. D. Adams, et al., Monte Carlo simulation of phase separation during thin-film codeposition; J. Appl. Phys. 74 (3), Aug. 1, 1993, 1707-1715.

C. D. Adams, et al; Phase separation during co-deposition of Al-Ge thin films; J. Mat Phys. vol. 7, No. 3, p. 653-666 (1992).

\* cited by examiner

METHOD OF MANUFACTURING A SEMICONDUCTOR DEVICE

BACKGROUND OF THE INVENTION

1. Field of the Invention

This invention relates to a semiconductor device and a method of manufacturing the same. More particularly, the present invention relates to a novel semiconductor device applicable to a surface emission light emitting device, an emission type display apparatus and an image sensor and also to a method of manufacturing such a semiconductor device.

2. Related Background Art

Conventionally, arrays of semiconductor devices such as diodes and transistors are prepared by regularly arranging semiconductor device chips that are manufactured individually and connecting them with wires. However, in the trend of downsizing and highly integrating electronic equipment in recent years, semiconductor devices are required to be arranged highly densely to form sophisticated single chips.

For example, the individual diodes of a photodiode array that is used for a light detecting section of a CCD chip mounted in an area image sensor minimally have a side as small as 3 µm. The design rule for the most advanced semiconductor processes that are used for CPUs operating as brains of personal computers and DRAMs, which are sophisticated memories, refers to 0.13 µm. This signifies that 0.13 µm is the lowest limit for structures that can be prepared on a commercial basis at present by means of semiconductor processing techniques using photolithography.

Known methods for preparing micro-structures include those for directly preparing micro-structures by means of a semiconductor processing technique such as a micro-pattern forming technique that typically utilizes photolithography using light with a shorter wavelength, electron beam exposure or X-ray exposure.

Meanwhile, apart from above-described semiconductor processing techniques, techniques of utilizing the phenomenon of self-organization of materials are also known. Such techniques are intended to realize novel micro-structures on the basis of a regular structure that is formed in the course of nature.

Research efforts are being paid for developing techniques of utilizing the phenomenon of self-organization because such techniques appear to be very promising for easily realizing micro-structures in the order of micrometers or nanometers.

As for anodization of aluminum, a porous oxide film coat (anodized alumina) is formed when an aluminum plate or an aluminum film formed on a substrate is anodized in an acidic electrolyte. (See R C. Furneaux, W. R. Rigby & A. P. Davidson, Nature, Vol. 337, P 147 (1989).) Such a porous oxide film coat is characterized by having a peculiar structure where very small cylindrical pores (nano-holes) of a diameter between tens to hundreds of several nanometers are arranged in parallel at intervals (cell size) of also tens to hundreds of several nanometers. When the gap separating the pores is tens of several nanometers or more, the pores show a high aspect ratio and their diameters are relatively highly uniform if viewed in cross section. The diameters and the intervals of the pores can be controlled to a certain extent by selecting the type of acid and regulating the voltage for anodization. Specifically, the intervals of the pores can be reduced by lowering a voltage. On the other hand, the thickness of the anodized film coat and the depth of the pores can be controlled to a certain extent by controlling the time for anodization.

Attempts are being made to apply anodization to various technical fields including coloring, magnetic recording mediums, EL light emitting elements, electro-chromic elements, optical elements, solar cells and gas sensors by using a technique of filling metal or semiconductor in the anodized nano-holes or a nano-hole replica technique. Furthermore, expectations are high for applying anodization to other technical fields including quantum effect devices such as quantum wires and MIM devices and molecule sensors using nano-holes as fields of chemical reactions (Masuda "Solid-state Physics" 31, 493 (1996)). Besides, Japanese Patent Application Laid-Open No. 2001-162600 proposes a light emitting device that is formed by burying ZnO in alumina nano-holes to show different intensities in the wavelengths of emitted light between in the direction parallel to and in the direction perpendicular to the substrate.

As an example of a process for forming micro-structures except for a process using nano-holes, Japanese Patent Application Laid-Open No. H10-321834 discloses a method of forming a wire-shaped agglomerate of metal micro-particles by utilizing the phenomenon that metal micro-particles are apt to be bonded together in a self-organizing manner due to their electric or magnetic interactions.

There is a report that single crystal nano-wires of p-type and n-type indium-phosphor are prepared by means of a vapor-liquid-solid (VLS) method of growing nano-wires in a self-organizing manner, using micro-particles of gold or the like as catalyst, and brought into contact with each other to cause them emit light (M. Lieber et al., Nature, Vol. 409, P 66 (2001)).

Now, as the demand increases for devices such as CCDs formed by incorporating semiconductor parts and made to be more downsized and sophisticated, semiconductor processing techniques such as lithography are required to show a precision level of 0.1 µm or higher. However, when deep ultraviolet rays or X-rays whose wavelength is even shorter are used for the light source, there arises a problem that preparation of a scaled down optical system is difficult and the light source inevitably has large dimensions. In the case of electron beam lithography, the drawing speed is low.

As pointed out above, difficulties dramatically increase to processes of directly preparing micro-structures as the size of individual elements diminishes by means of conventional semiconductor processing techniques including micro-pattern forming techniques such as photolithography.

Furthermore, processes of directly manufacturing micro-structures by means of semiconductor processing techniques are accompanied by additional problems including a poor yield and a high capital investment level. Therefore, there is a demand for techniques that can prepare micro-structures by a simple technique with an enhanced level of reproducibility.

It is, therefore, an object of the present invention to provide a semiconductor device of a size of the order of nanometers that can exhibit a quantum effect and an array of such semiconductor devices.

Another object of the present invention is to provide a method of manufacturing a high density semiconductor device and a device formed by using such an array.

SUMMARY OF THE INVENTION

In view of the above identified circumstances, the inventors of the present invention researched the above problems and found that semiconductor nano-devices can be formed and arranged highly densely by using a novel nano-structure material that can be used to form cylinder-shaped structures having a size in the order of nanometer. The present invention is based on this finding.

In the first aspect of the present invention, there is provided a semiconductor device array formed by arranging a plurality of semiconductor devices on a substrate, the device array comprising: a porous body having cylinder-shaped pores and formed by removing cylinder-shaped regions from a structure including a matrix member comprising a second ingredient capable of forming a eutectic crystal with a first ingredient and the cylinder-shaped regions comprising the first ingredient and dispersed in the matrix member; semiconductor regions formed in the pores, each of the semiconductor regions having at least a p-n junction or a p-i-n junction; and a pair of electrodes arranged as sandwiching the semiconductor regions.

In the second aspect of the present invention, there is provided a semiconductor device array formed by arranging a plurality of semiconductor devices on a substrate, the device array comprising: semiconductor regions formed by filling a semiconductor material into cylinder-shaped pores of a porous body, the porous body being formed by removing cylinder-shaped regions from a structure including a matrix member comprising a second ingredient capable of forming a eutectic crystal with a first ingredient and the cylinder-shaped regions comprising the first ingredient and dispersed in the matrix member, and subsequently removing the matrix member, each of the semiconductor regions having at least a p-n junction or a p-i-n junction; and a pair of electrodes arranged as sandwiching the semiconductor regions.

For the purpose of the present invention, the semiconductor devices are preferably diodes, which may be light-emitting diodes or photodiodes. Alternatively, the semiconductor devices may be transistors, phototransistors in particular.

For the purpose of the present invention, the porous body is preferably thin and film-shaped.

A device array according to the invention is preferably obtained by chemically treating the porous body and subsequently preparing the semiconductor devices in the pores. Preferably, the chemical treatment is oxidation.

For the purpose of the present invention, the ratio of the second ingredient of the matrix member of the porous body relative to the structure is preferably not smaller than 20 atomic % and not greater than 70 atomic %. Preferably, the first ingredient of the cylinder-shaped regions is aluminum and the second ingredient of the matrix member is silicon or germanium.

For the purpose of the present invention, the principal ingredient of the porous body is preferably silicon or germanium.

For the purpose of the present invention, the diameter of the semiconductor devices is preferably not smaller than 0.5 nm and not greater than 15 nm, more preferably not smaller than 1 nm and not greater than 10 nm.

For the purpose of the present invention, the intervals of arrangement of the semiconductor devices is preferably not greater than 15 nm, more preferably not smaller than 3 nm and not greater than 10 nm.

For the purpose of the present invention, the cylinder-shaped regions are preferably made of a crystalline material and the matrix member is preferably made of an amorphous material.

In the third aspect of the present invention, there is provided a method of manufacturing a semiconductor device array comprising:
(a) a step of arranging an electrode on a substrate;
(b) a step of forming a structure including a matrix member containing a second ingredient capable of forming a eutectic crystal with a first ingredient and cylinder-shaped regions containing the first ingredient and dispersed in the matrix member on the substrate;
(c) a step of removing the cylinder-shaped regions;
(d) a step of forming semiconductor regions, each having at least a p-n junction or a p-i-n junction, in the cylinder-shaped pores obtained as a result of the above removing step;
(e) a step of forming another electrode on the top of the structure in which the semiconductor regions are formed.

For the purpose of the present invention, etching is preferably used for the removing step.

A method of manufacturing a semiconductor device array according to the invention may further comprise a step of chemically treating the matrix member containing the second ingredient after the step of removing the cylinder-shaped regions.

Preferably, the chemical treatment is oxidation.

A method of manufacturing a semiconductor device array according to the invention may further comprise a step of increasing the pore diameter of the cylinder-shaped pores after the step of removing the cylinder-shaped regions.

A method of manufacturing a semiconductor device array according to the invention may further comprise a step of removing the matrix member surrounding the cylinder-shaped regions after the step of forming another electrode on the top of the structure.

A chemical vapor phase deposition (CVD) method is preferably used for the step of forming semiconductor regions.

For the purpose of the present invention, the step of forming semiconductor regions is preferably performed by means of a catalytic reaction after forming a catalyst at the bottoms of the pores.

A method of manufacturing a semiconductor device according to the invention comprises a step of preparing a structure including a plurality of cylinder-shaped members and a region surrounding the cylinder-shaped members, a step of forming a porous body having cylinder-shaped pores by removing the cylinder-shaped members from the structure and a step of introducing a material into the pores of the porous body and forming p-n or p-i-n junctions.

A semiconductor device according to the present invention is obtained by forming p-n junctions or p-i-n junctions in a porous body obtained by removing cylinder-shaped members from a structure including the cylinder-shaped members and a region surrounding the cylinder-shaped members.

For the purpose of the present invention, the cylinder-shaped members formed so as to contain a first material are surrounded by the region formed so as to contain a second material in the structure and the structure contains the second material at a ratio not smaller than 20 atomic % and not greater than 70 atomic % relative to the total quantity of the first material and the second material.

DESCRIPTION OF THE PREFERRED EMBODIMENTS

Figure 1A:
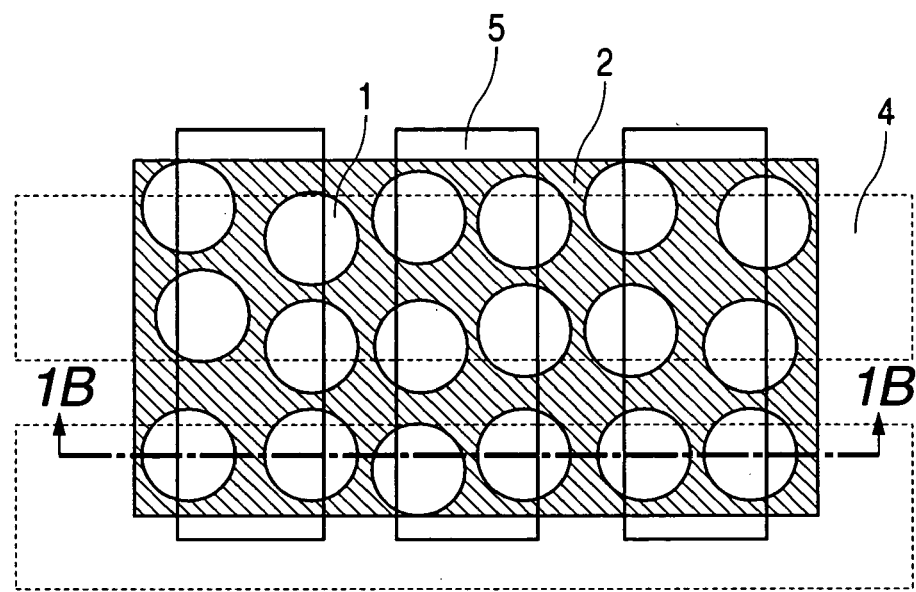
FIGS. 1A and 1B schematically illustrate semiconductor devices having a p-n junction.

Now, the present invention will be described in greater detail by referring to the accompanying drawings that illustrate preferred embodiments of the invention.

Before describing the embodiments, firstly a structure including a matrix member comprising a second ingredient (material) capable of forming a eutectic crystal with a first ingredient (material) and cylinder-shaped regions comprising the first ingredient and dispersed in the matrix member that is used for the purpose of the invention will be described.

(Experiment: First Material Al, Second Material Si)

Aluminum wires were prepared as a structure including aluminum pillars as so many aluminum parts of the structure and a silicon part surrounding the cylinder-shaped aluminum pillars, of which the aluminum pillars had a diameter 2r of 3 nm and a length L of 200 nm and were arranged in such a way that each pillar was separated from adjacent pillars by a gap 2R of 7 nm.

The aluminum wires were prepared in a manner as described below.

An aluminum/silicon mixture film containing silicon by 55 atomic % relative to the total quantity of aluminum and silicon was formed to a thickness of about 200 nm on a glass substrate by RF magnetron sputtering. A target formed by placing eight 15 mm-squared silicon chips 13 on a 4-inch aluminum target was used. The sputtering operation was conducted by using an RF power source under the condition of an Ar flow rate: 50 sccm, a discharge pressure: 0.7 Pa and a making power: 1 kW. The substrate was held to room temperature.

While the target was formed by placing eight 15 mm-squared silicon chips 13 on an aluminum target in this experiment, the number of silicon chips is not limited to eight and may be varied depending on the sputtering condition so long as the formed aluminum/silicon mixture film contains silicon by about 55 atomic %. The target is not limited to one obtained by placing silicon chips on an aluminum target. Alternatively, a target formed by placing aluminum chips on a silicon target or a target formed by sintering powdery silicon and powdery aluminum may be used.

Then, the obtained aluminum/silicon mixture film was analyzed for the partial quantity (atomic %) of silicon relative to the total quantity of aluminum and silicon by means of ICP (inductively coupled plasma emission spectrometry). As a result, the partial quantity of silicon relative to the total quantity of aluminum and silicon was found to be about 55 atomic %. Note that, in this experiment, the aluminum/silicon mixture film was deposited on a carbon substrate for the convenience of analysis.

Thereafter, the aluminum/silicon mixture film was observed through an FE-SEM (field emission scanning electron microscope). When the surface was viewed from right above the substrate, it was found that circular aluminum nano-structure parts were two dimensionally arranged and surrounded by silicon there. The aluminum nano-structure parts had a diameter of 3 nm and the average distance between the centers of adjacently located aluminum nano-structure parts was 7 nm. When a cross section of the specimen was observed through an FE-SEM, it was found that the aluminum nano-structure parts had a length of 200 nm and were independent from each other.

When the specimen was observed by X-ray diffractometry, no silicon peaks that show crystallinity of silicon were found to prove that the silicon of the specimen was amorphous.

Thus, an aluminum/silicon nano-structure including aluminum wires having a diameter $2r$ of 3 nm and a length L of 200 nm, each being separated from adjacent pillars by a distance $2R$ of 7 nm, and surrounded by silicon was obtained.

(Experiment for Comparison)

As specimen A for comparison, an aluminum/silicon mixture film containing silicon by 15 atomic % relative to the total quantity of aluminum and silicon was formed to a thickness of about 200 nm on a glass substrate by sputtering. A target formed by placing two 15 mm squared silicon chips 13 on a 4-inch aluminum target was used. The sputtering operation was conducted by using an RF power source under the condition of an Ar flow rate: 50 sccm, a discharge pressure: 0.7 Pa and a making power: 1 kW. The substrate was held to room temperature.

Thereafter, the specimen A was observed through an FE-SEM. When the surface was viewed from right above the substrate, it was found that the aluminum nano-structure parts were not circular but appeared like ropes. In other words, a nano-structure in which cylinder-shaped aluminum structure parts were uniformly dispersed in a silicon region was not obtained. The size of the cylinder-shaped aluminum structure parts by far exceeded 10 nm. When a cross section of the specimen was observed through an FE-SEM, it was found that the aluminum nano-structure parts had a width exceeding 15 nm. The obtained aluminum/silicon mixture film was analyzed for the partial quantity (atomic %) of silicon relative to the total quantity of aluminum and silicon by means of ICP. As a result, the partial quantity of silicon relative to the total quantity of aluminum and silicon was found to be about 15 atomic %.

Additionally, as specimen B for comparison, an aluminum/silicon mixture film containing silicon by 75 atomic % relative to the total quantity of aluminum and silicon was formed to a thickness of about 200 nm on a glass substrate by sputtering. A target formed by placing fourteen 15 mm-squared silicon chips 13 on a 4-inch aluminum target was used. The sputtering operation was conducted by using an RF power source under the condition of an Ar flow rate: 50 sccm, a discharge pressure: 0.7 Pa and a making power: 1 kW. The substrate was held to room temperature.

Thereafter, the specimen B was observed through an FE-SEM. When the surface was viewed from right above the substrate, no aluminum parts were found. When a cross section of the specimen was viewed through an FE-SEM, no aluminum parts were clearly observed. The obtained aluminum/silicon mixture film was analyzed for the partial quantity (atomic %) of silicon relative to the total quantity of aluminum and silicon by means of ICP. As a result, the partial quantity of silicon relative to the total quantity of aluminum and silicon was found to be about 75 atomic %.

Aluminum/silicon mixture film specimens containing silicon respectively by 20 atomic %, 35 atomic %, 50 atomic %, 60 atomic % and 70 atomic % relative to the total quantity of aluminum and silicon were formed under the condition same as that of specimen A for comparison except that different number of silicon chips were used. In the table below, specimens in which cylinder-shaped aluminum structure parts were uniformly dispersed are marked by o, whereas those in which cylinder-shaped aluminum structure parts were not uniformly dispersed are marked by x.

TABLE 1

| silicon ratio (atomic %) | nano-structure |
| --- | --- |
| 15 (specimen A for comparison) | x |
| 20 | o |
| 25 | o |
| 35 | o |
| 50 | o |
| 55 | o |
| 60 | o |
| 65 | o |
| 70 | o |
| 75 (specimen B for comparison) | x |

Thus, the diameter of the produced aluminum nano-structure structure parts can be controlled by regulating the partial quantity of silicon relative to the total quantity of aluminum and silicon so as to be not smaller than 20 atomic % and not greater than 70 atomic %. With this arrangement, it is possible to produce highly linear aluminum wires. A TEM (transmission electron microscope) or the like may be used to observe the structure of the produced nano-structure in place of an SEM. The above statement about the silicon content also applies when silicon is replaced by germanium or a mixture of silicon and germanium is used.

Still additionally, as specimen C for comparison, an aluminum/silicon mixture film containing silicon by 55 atomic % relative to the total quantity of aluminum and silicon was formed to a thickness of about 200 nm on a glass substrate by sputtering. A target formed by placing eight 15 mm silicon chips 13 on a 4-inch aluminum target was used. The sputtering operation was conducted by using an RF power source under the condition of an Ar flow rate: 50 sccm, a discharge pressure: 0.7 Pa and a making power: 1 kW. The substrate was held to 250° C.

Thereafter, the specimen C was observed through an FE-SEM. When the surface was viewed from right above the substrate, no clear boundaries of aluminum and silicon were found. In other words, no aluminum/silicon nano-structure parts were found. It may be safe to assume that, when the substrate temperature is too high, the deposited film is moved into a more stable state to prevent growth of a film adapted to form aluminum nano-structure parts.

Preferably, the composition of the target can also be selected to show a ratio of Al:Si=55:45 for the purpose of producing a structure including dispersed cylinder-shaped members.

Now, the present invention will be described by way of embodiments.

Figure 1B:
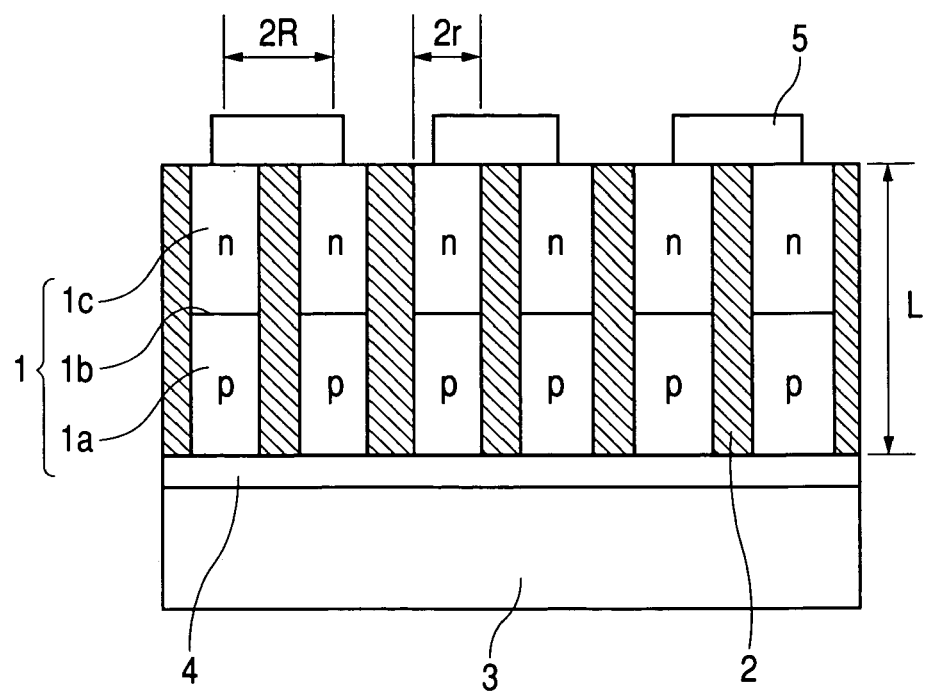

FIGS. 1A and 1B schematically illustrate a semiconductor device which is an array of diodes each having a single p-n junction that can be used for the purpose of the present invention. FIG. 1A is a schematic plan view and FIG. 1B is a schematic cross sectional view taken along line 1B—1B in FIG. 1A. In FIGS. 1A and 1B, reference symbol 1a denotes p-type semiconductor parts and reference symbol 1b denotes p-n junction planes, whereas reference symbol 1c denotes n-type semiconductor parts. These parts form the semiconductor parts 1 (semiconductor regions) of the diodes. The semiconductor parts of the diodes are formed in respective pores of a porous thin film. The porous thin film is produced as cylinder-shaped regions are removed from a thin film that comprises a plurality of ingredients capable of forming a eutectic crystal with each other and in which an ingredient forms cylinder-shaped nano-structure parts and dispersed in a matrix member of another ingredient. The pores of the porous thin film are independent from each other and substantially perpendicular relative to the substrate. Therefore, the semiconductor parts 1 of the diodes are separated from each other by the matrix member 2. The film formed from the plurality of materials capable of forming a eutectic crystal is produced on the substrate 3 on which a lower electrode 4 is placed, whereas an upper electrode 5 is formed on top of the thin film. Instead of placing a lower electrode 4 on the substrate 3, an entirely electro-conductive substrate may be used so as to make it also operate as lower electrode.

Figure 2A:
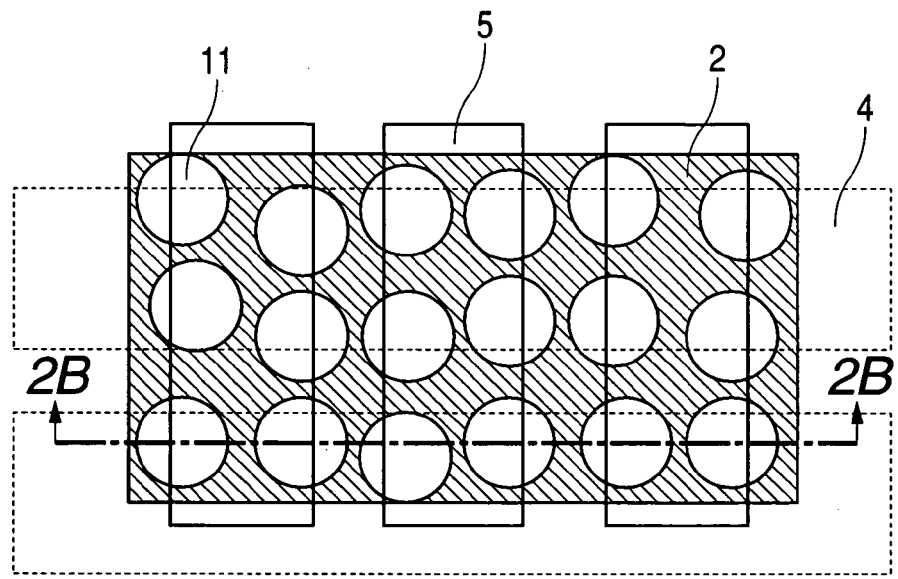
FIGS. 2A and 2B schematically illustrate semiconductor devices having a p-i-n junction.
Figure 2B:
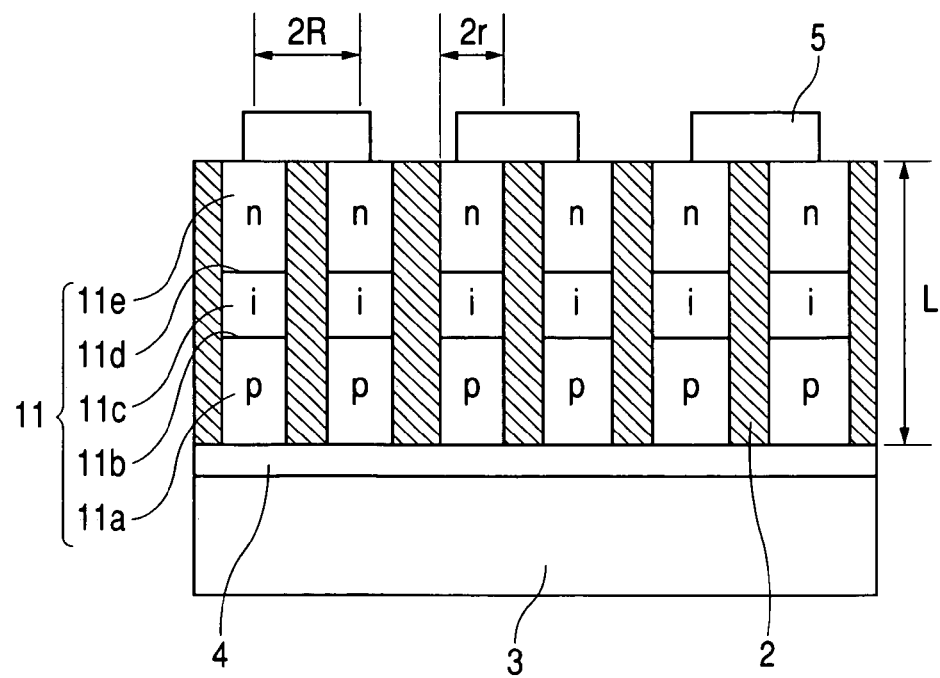
Figure 3A:
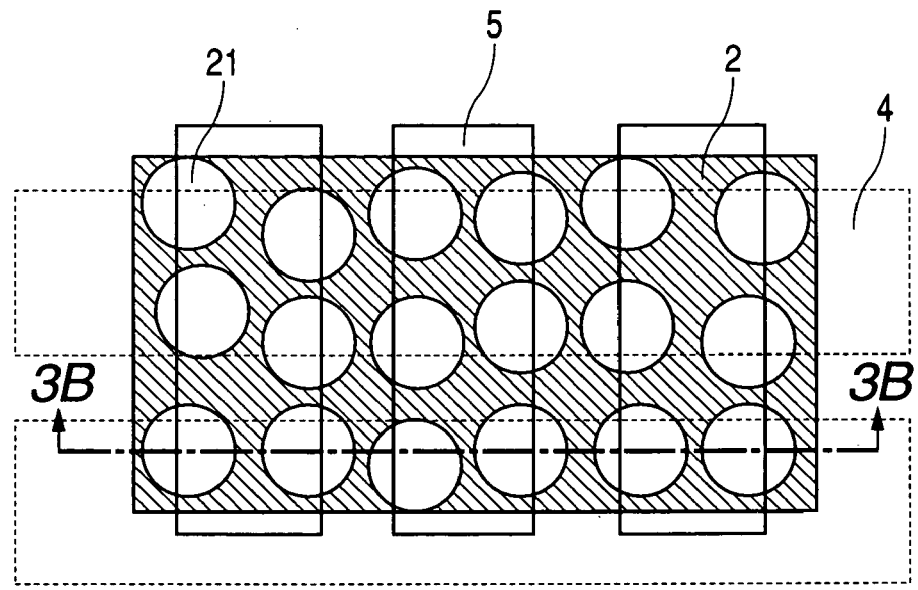
FIGS. 3A and 3B schematically illustrate semiconductor devices having two p-n junctions.
Figure 3B:
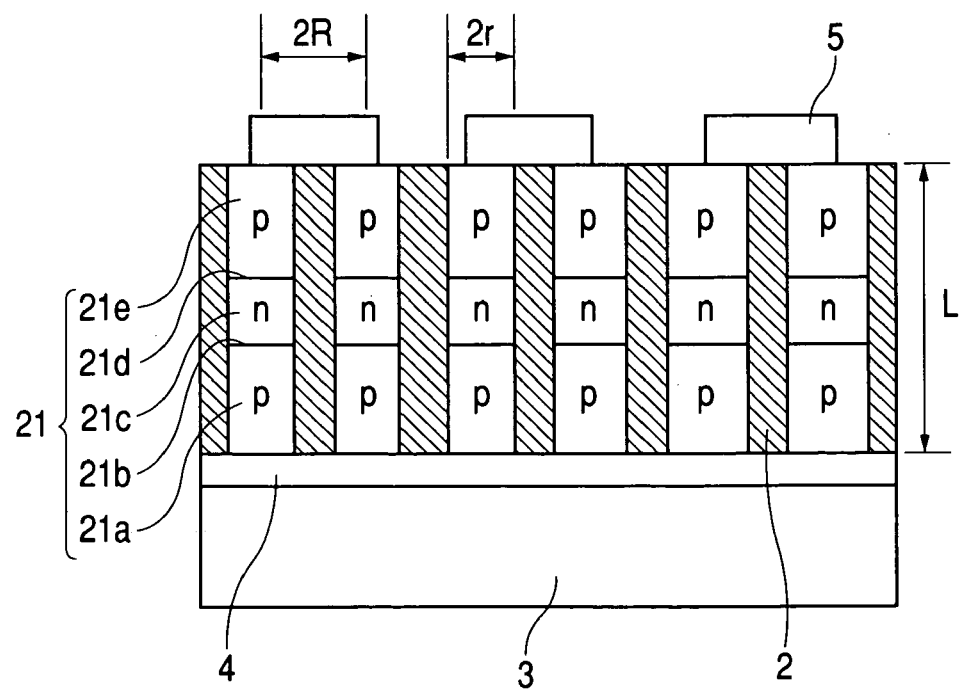

While FIGS. 1A and 1B show diodes each having a single p-n junction, diodes formed in respective pores and each having a p-i-n junction as shown in FIGS. 2A and 2B or transistors each having two p-n junctions as shown in FIGS. 3A and 3B are also found within the scope of the present invention. The symbol i in the above expression of p-i-n junction stands for intrinsic semiconductor. Note that p-i-n junctions are used to enhance the light emitting efficiency of light emitting diodes or the like. In FIGS. 2A and 2B, there are shown semiconductor parts of diodes 11 including p-type semiconductor parts 11a, p-i junction planes 11b, intrinsic semiconductor parts 11c, i-n junction planes 11d and n-type semiconductor parts 11e. In FIGS. 3A and 3B, there are shown semiconductor parts of transistors 21 including p-type semiconductor parts 21a, p-n junction planes 21b, n-type semiconductor parts 21c, p-n junction planes 21d and p-type semiconductor parts 21e. The p-type semiconductor parts and n-type semiconductor parts in FIGS. 1A through 3B may be inversely arranged.

The pores of a semiconductor device according to the invention may show a substantially circular profile as illustrated in FIGS. 1A, 2A and 3A or some other appropriate profile such as elliptic when viewed from above relative to the substrate.

When viewed in cross section running through the substrate, the semiconductor parts of a semiconductor device according to the invention may show a rectangular profile as illustrated in FIGS. 1B, 2B and 3B or a square profile, which can be realized when the film thickness is reduced. Alternatively, they may be made to show a profile of frustum or an oblong hexagonal profile by selecting an appropriate process for preparing the nano-structures. The (average) diameter 2r of the semiconductor parts of a semiconductor device according to the invention is not smaller than 0.5 nm and not greater than 15 nm, whereas the (average) distance 2R between adjacent pores is not greater than 15 nm. Preferably, the diameter 2r is between 1 and 10 nm and the distance 2R is between 3 and 10 nm. The length L of the semiconductor parts of a semiconductor device (array) according to the invention is between 2 nm and several μm, preferably between 5 nm and 1,000 nm. If they show an elliptic profile, it is sufficient for the major axis of the ellipse to be found within the above cited range. The average diameter as used herein refers to the value that can be obtained when the pores (in an area of about 100 nm×70 nm) shown on a SEM photograph are subjected to an image processing operation of a computer.

The cylinder-shaped profile of the semiconductor parts of a semiconductor device (array) according to the invention may have an aspect ratio (length L/pore diameter $2r$) so long as their dimensions meet the above requirements, although the desirable aspect ratio (length L/pore diameter $2r$) is between 0.5 and 1,000.

It should be noted here that a semiconductor device according to the invention refers to a plurality of semiconductor devices that are handled as a set of semiconductor devices to which upper and lower electrode are connected respectively at the top and the bottom thereof. Thus, the semiconductor devices are formed as a single semiconductor device, or a semiconductor device array, because it is not possible to wire the individual semiconductor devices with the state of the art lithography technology as pointed out earlier in "Related Background Art".

Now, the steps of preparing a semiconductor device according to the invention will be described below in detail by referring to FIGS. 4A through 4E, which correspond to steps (a) through (e) below.

(a) Preparation of Lower Electrode

Figure 4A:
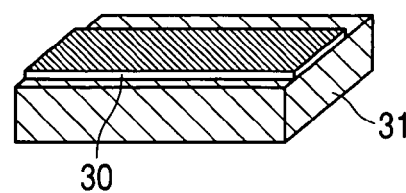
FIGS. 4A, 4B, 4C, 4C', 4D and 4E schematically illustrate a method of manufacturing a semiconductor device.

An electrode 30 is prepared on a substrate 31 on which semiconductor devices are to be formed as shown in FIG. 4A. Any process may be used to prepare the electrode 30 so long as it involves depositing metal on the substrate by evaporation to produce the electrode 30. While no patterning operation is necessary, the semiconductor devices on the substrate can be driven individually when the electrode is subjected to patterning.

Any material may be used for the substrate so long as it withstands the process for preparing a semiconductor device according to the invention. For example, a silicon wafer or a glass substrate may advantageously be used. The substrate does not necessarily have to have a smooth plate-shaped profile. In other words, the substrate is not subjected to any specific limitations and a substrate having a curved surface or one having surface undulations or steps of certain extent may alternatively be used so long as it is not disadvantageous for preparing semiconductor devices on it.

Furthermore, any material may be used for the lower electrode that is placed on the surface of the substrate so long as it withstands the process for preparing a semiconductor device according to the invention. For example, gold or platinum may advantageously be used for the lower electrode.

(b) Preparation of Nano-structure

Figure 4B:
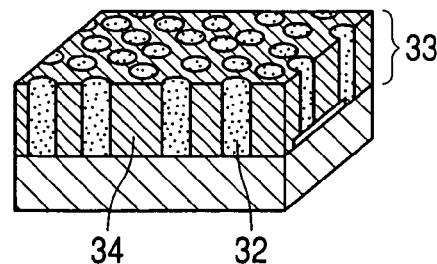

Then, as shown in FIG. 4B, a thin film 33 is formed for a nano-structure on the substrate 31, which may carry a lower electrode 30 thereon or be electrically conductive. For the purpose of the present invention, a nano-structure refers to a material in which a first ingredient in the form of nano-pillars is dispersed in the matrix of a second ingredient. The inventors of the present invention have found as a result of research efforts that such a structure can be formed by substances of a eutectic system.

While no limitations are imposed on the plurality of ingredients that show a eutectic relationship, it has been found that a nano-structure which meets the objective of the present invention can be formed when aluminum is selected for the first ingredient and silicon or germanium (or a mixture of silicon and germanium) is selected for the second ingredient of the plurality of ingredient.

The first and second ingredients can form a nano-structure that meet the objective of the present invention when they are put into a non-equilibrium state. This is because a nano-structure region 33 of the two ingredients that is prepared by way of a film forming process of forming a substance in a non-equilibrium state becomes to show a eutectic type texture where the two ingredients are in a metastable state and eventually separate from each other in a self-organizing manner in such a way that the first ingredient forms nano-structure parts 32 having a diameter of the level of several nm and surrounded by the second ingredient region 34.

Figure 9:
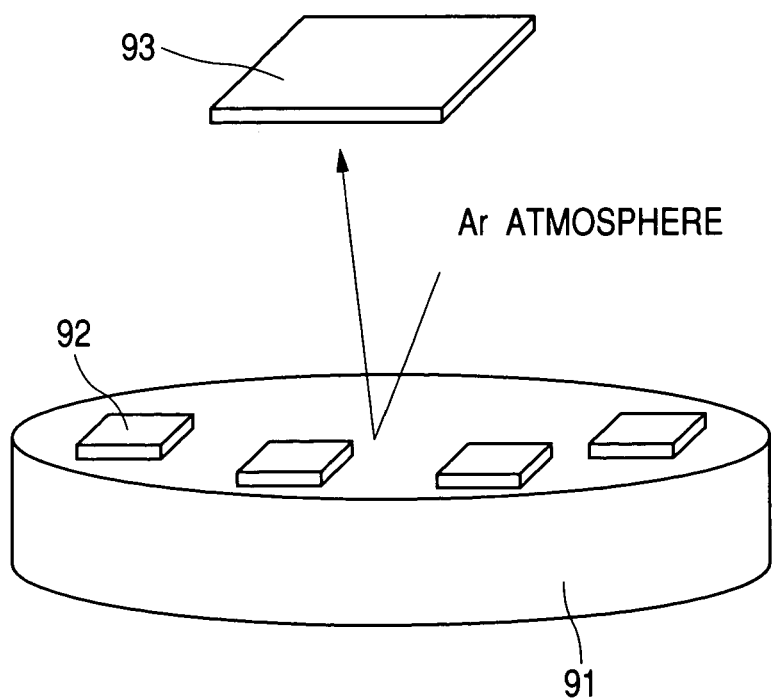
FIG. 9 is a schematic illustration of a method of preparing a structure according to the invention.

A typical technique for bringing them into a non-equilibrium state is sputtering. A non-equilibrium state of the first and second ingredients that are used as raw materials is realized as a chip 92 of the second ingredients is arranged on a target of the first ingredient 91 as shown in FIG. 9. The chip of the second ingredient may be divided into a plurality of chips or a single chip may be used without dividing. However, it should be noted that the first ingredient is preferably placed symmetrically relative to the substrate 93 (e.g., concentrically) in order to uniformly disperse the cylinder-shaped structure parts of the first ingredient in the second ingredient region. Alternatively, a baked mixture prepared by baking powder of a predetermined quantity of the first ingredient and that of the second ingredient may be used as target material for preparing the nano-structure. Still alternatively, a target of the first ingredient and that of the second ingredient may be arranged separately for simultaneous sputtering.

The partial quantity of the second ingredient in the formed film is typically 20 to 70 atomic %, preferably 25 to 65 atomic %, more preferably 30 to 60 atomic % relative to the total quantity of the first and second ingredients when the first ingredient is aluminum and the second ingredient is silicon or germanium. When the quantity of silicon or germanium is within the above defined range, it is possible to obtain an aluminum/silicon or aluminum/germanium nano-structure in which cylinder-shaped aluminum structure parts are dispersed in a silicon or germanium region.

For the purpose of the present invention, atomic % for indicating the content ratio of aluminum or that of silicon refers to the number percentage of atoms of silicon or aluminum and may also be expressed as at %. It is typically determined by quantitative analysis of silicon and aluminum in an aluminum/silicon mixture film by means of inductively coupled plasma emission spectrometry.

While atomic % is used as unit to express the content ratio of aluminum or silicon, weight percentage (wt %) may alternatively be used. Then, a silicon content ratio of not smaller than 20 atomic % and not greater than 70 atomic % will be paraphrased into not smaller than 20.65 wt % and not greater than 70.84 wt %. (Atomic % is reduced into wt % by determining the weight ratio of Al and Si, using atomic weights of 26.982 and 28.086 respectively for Al and Si, and substituting the terms of the formula of (weight ratio)× (atomic %) by the obtained corresponding values).

The substrate temperature is preferably not higher than 200° C. Preferably, it is within a temperature range between room temperature and 150° C., more preferably from 100° C. to 150° C.

When aluminum is selected for the first ingredient and silicon or germanium is selected for the second ingredient and a nano-structure is formed by means of the above described technique, aluminum and silicon or germanium form a metastable eutectic texture, in which aluminum forms nano-structure parts (cylinder-shaped structure parts) in the order of several nm in a matrix of silicon or germanium, whichever appropriate, and aluminum and silicon or germanium, whichever appropriate, separate from each other in a self-organizing manner. Then, the nano-structure parts of aluminum show a substantially cylinder-shaped profile with a diameter between 1 and 15 nm and the distance separating adjacent nano-structure parts of aluminum is between 3 and 15 nm.

The diameter of the pillars of aluminum can be made to vary as a function of the height to make them show a frusto-conical profile or a spindle-shaped profile by changing the substrate temperature and/or the making power during the sputtering process.

The silicon or germanium content ratio of the aluminum/silicon or aluminum/germanium nano-structure can be controlled by selecting the quantity of the silicon or germanium chips on the aluminum target.

When forming film in a non-equilibrium state particularly by means of sputtering, causing argon gas to flow, the pressure in the reactor is preferably between 0.2 and 1 Pa and the power for producing plasma is preferably between about 150 and 1,000 W provided that a 4-inch target is used. However, the present invention is by no means limited to those numerical values so long as the pressure and the power can produce argon plasma on a stable basis.

While sputtering is most preferably used for forming film of a substance in a non-equilibrium state, other techniques for forming film in a non-equilibrium state such as resistance heat evaporation and electron beam evaporation (EB evaporation) are also applicable. Sputtering may be magnetron sputtering, RF sputtering, ECR sputtering or DC sputtering.

For the purpose of the present invention, a simultaneous film forming process of forming the first and second ingredients at the same time may be used. Alternatively, a multilayer film forming process of forming several atomic layers for each of the first ingredient and the second ingredient may be used.

The nano-structure region 33 of the first and second ingredients formed as a result of the above described film forming process includes cylinder-shaped structure parts 32 containing the first ingredient as principal ingredient and a region 34 surrounding them and containing the second ingredient as principal ingredient. The region 34 is preferably amorphous.

While the cylinder-shaped structure parts 32 contain the first ingredient as principal ingredient, they may additionally contain other elements such as oxygen, argon and/or nitrogen so long as cylinder-shaped nano-structure parts are obtained. The expression of "principal ingredient" as used herein refers to the content ratio of the first ingredient in the cylinder-shaped structure parts that is not smaller than 80 atomic %, preferably not smaller than 90 atomic %.

Similarly, the region 34 of the second ingredient surrounding the cylinder-shaped structure parts of the first ingredient may additionally contain other elements such as oxygen, argon, nitrogen and/or hydrogen so long as cylinder-shaped nano-structure parts are established. The expression of principal ingredient as used herein refers to the content ratio of the second ingredient in the region surrounding the cylinder-shaped structure parts that is not smaller than 80 atomic %, preferably not smaller than 90 atomic %.

(c) Formation of Pores

Figure 4C:
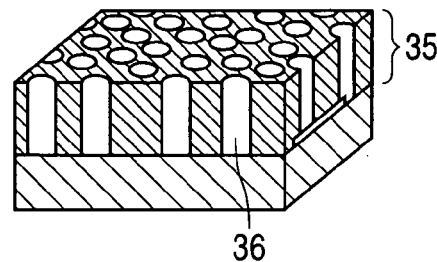
Figure 4C:
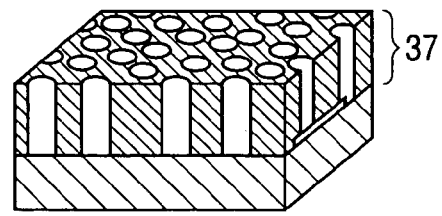
Figure 4D:
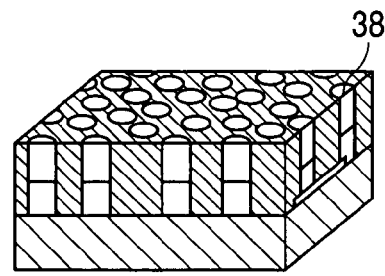

Only the cylinder-shaped structure parts 32 of the first ingredient are selectively removed from the nano-structure thin film by etching as shown in FIG. 4C. As a result, only the region of the second ingredient having pores 36 is left. Thus, a porous thin film 35 of the second ingredient is produced.

When the first ingredient is aluminum and the second ingredient is silicon, solutions that can be used for wet etching for the purpose of the present invention include those of acids such as phosphoric acid, sulfuric acid, hydrochloric acid and chromic acid that dissolve easily aluminum but hardly silicon. However, solutions of alkalis such as sodium hydroxide solution may also be used if the use of such solutions is not disadvantageous for forming pores in the thin film. There are no limitations to the type of acid and alkali solutions that can be used for the purpose of the present invention. Furthermore, a mixture of several acid solutions or several alkali solutions may also be used. The etching condition including solution temperature, solution density, duration and so on may be selected appropriately depending on the silicon nano-structure to be prepared.

The steps (c'-1) and (c'-2) described below are not indispensable. In other words, they may be employed depending on the second ingredient and the performance of the produced semiconductor device.

(c'-1) Oxidation of Nano-structure of Second Ingredient

When the second ingredient is a semiconductor element such as silicon or germanium or some other electrically conductive material, the obtained nano-structure having pores has to be transformed into an electrically non-conductive structure by way of an oxidation process in order to electrically insulate it from the semiconductor devices in the pores. Additionally, when the nano-structure having pores is removed in a subsequent step as will be described hereinafter, it also has to be subjected to an oxidation process so as to be transformed into a structure that can be etched out more quickly than the semiconductor device itself.

As a result of this step, the porous film 35 of the second ingredient becomes a porous film 37 of oxide of the second ingredient, a shown in FIG. 4C'.

When the second ingredient is silicon or germanium, methods of oxidizing the porous film of the second ingredient produced from the step (c) that can be used for the purpose of the invention include heating in an oxygen atmosphere, heating in steam or air, anodization and exposure to oxygen plasma. While the silicon oxide region contains silicon oxide as principal ingredient, it may additionally contain such as argon and/or nitrogen and oxides of elements. When the first ingredient is aluminum and the second ingredient is silicon, the silicon content ratio of the silicon oxide region is not smaller than 80 atomic %, preferably not smaller than 85 atomic % relative to the total quantity of all the elements except oxygen. If the first ingredient is aluminum, the aluminum content ratio is within a range between 0.01 and 20 atomic %, preferably between 0.1 and 10 atomic %, relative to the total quantity of all the elements except oxygen. While the silicon oxide of the silicon oxide nano-structure is preferably amorphous, it may be crystallized so as to make the structure contain crystalline silicon oxide.

(c'-2) Expansion of Pore Diameter

This step of expanding the pore diameter may be conducted on the porous film of the second ingredient after removing the cylinder-shaped material and the porous film of oxides.

A pore widening process (pore diameter expanding process) of immersing the porous film of the second ingredient or oxide of the second ingredient in a solution adapted to dissolve the second ingredient or oxide of the second ingredient is used to expand the pore diameter.

Solutions of any acids or alkalis may be used to expanding the pore diameter so long as the use of such a solution is not disadvantageous for expanding the pore diameter. A mixture of several solutions of different acids or alkalis may also be used for the purpose of the invention. For example, if the second ingredient is silicon, acidic solution obtained by diluting hydrofluoric acid or alkaline solution of sodium hydroxide may suitably be used as dissolving solution. The condition for expanding the pore diameter (in the pore widening process) including solution temperature, solution density, duration and so on may be selected appropriately depending on the size of the pores to be produced.

(d) Preparation of Semiconductor Parts of Semiconductor Devices

The semiconductor parts 38 of the semiconductor devices (diodes in FIG. 4D) to be formed in the pores are generally not subjected to any particular limitations so long as they have one or more than one p-n junctions or p-i-n junctions, although they are preferably diodes or bipolar transistors. If they are diodes, they are more preferably those having a light-emitting feature such as light-emitting diodes or those having a light-detecting feature such as photodiodes. If, on the other hand, they are transistors, they are more preferably those having a light-detecting feature such as phototransistors.

Materials that can be used for the semiconductor devices are also not subjected to any particular limitations so long as they are generally used for preparing semiconductor devices having one or more than one p-n junctions or p-i-n junctions. Examples of materials that can be used for the semiconductor devices include silicon and germanium. Examples of materials that can be used for light-emitting diodes include gallium arsenide type materials (GaAs/GaAlAs, GaAs/InGaAlP), gallium arsenide phosphide (GaAsP), gallium phosphide (GaP), indium phosphide and other compounds of III–V group elements that can be used as semiconductor device materials as well as indirect transition type materials such as silicon carbide (SiC), direct transition type materials such as gallium nitride type materials (GaN/InGaAlN) and compounds of II–VI group elements such as zinc selenide type materials (ZnSe/ZnSSe) that can also be used as semiconductor device materials. Of these, silicon that is popularly and broadly being used for semiconductor devices or gallium arsenide or gallium phosphide that is also popularly being used for light-emitting diodes is particularly preferable.

Dopants that are suited for the semiconductor material may be selected to selectively produce p-type and n-type semiconductors depending on the desired properties of the semiconductor devices to be manufactured. If, for example, silicon is used as semiconductor material, boron and phosphor are popularly used as dopants. If it is necessary to prepare a more functionally enhanced semiconductor device, a plurality of junction planes may be produced by replacing the dopants with different ones for a number of times. An intrinsic semiconductor material may be used without adding any dopant.

When III–V group compound is used as semiconductor material, it is possible to prepare a junction type semiconductor devices by regulating the content ratio of the two elements to selectively produce a p-type semiconductor, an n-type semiconductor and an intrinsic semiconductor.

The step of preparing semiconductor devices in the pores produced as a result of the step (c) can be conducted by using a method of growing semiconductor crystal without destructing the pore structure of the nano-structure.

If the chemical vapor phase deposition (CVD) method is used, semiconductor devices can be prepared in an atmosphere of a rare gas such as argon, xenon, helium, neon or krypton, hydrogen, hydrocarbon, fluorine, nitrogen, oxygen or the like. The condition in which a CVD process is conducted including gas flow rate, pressure and making power may be appropriately selected for the semiconductor material in question depending on the growth rate of the semiconductor devices. In the case where silicon semiconductor devices are produced, the raw material gas to be used for the CVD process is selected from silane compounds including monosilane, disilane, trisilane and tetrasilane that are expressed by general formula $Si_nH_{2n+2}$ (where n is a natural number), silane fluoride, organic silanes, hydrocarbons and germane compounds. As diluent gas, hydrogen, heavy hydrogen, fluorine, chlorine, helium, argon, neon, xenon, krypton or nitrogen may be introduced with the raw material gas. When such gas is used, the addition of diluent gas is effective when it is added to a ratio of 0.01 to 100% (volume ratio) relative to the raw material gas, although the exact ratio is determined on the basis of the properties of the semiconductor devices to be prepared.

The VLS method makes it easier to selectively form a semiconductor material in the pores if it is used instead of the CVD method. With the VLS method, gold particles are formed on the bottoms of the pores of the nano-structure by electrodeposition and nano-wires are made to grow out of organic metal gas, using the deposited gold particles as catalyst.

The condition including temperature in which the semiconductor parts of the semiconductor devices are formed in the pores may be appropriately selected depending on the semiconductor material in question.

(e) Preparation of Upper Electrode

Figure 4E:
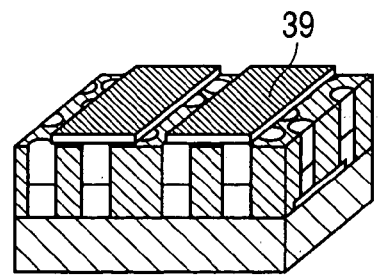

As in the case of preparing the lower electrode in the step (a), any appropriate process may be used for the step of preparing an electrode 39 in FIG. 4E on the top of the nano-structure in which semiconductor devices are formed.

Any material that conducts electricity well may be used for the upper electrode. An appropriate value may be selected for the thickness of the upper electrode.

When a number of lower electrodes are arranged in parallel with each other at regular intervals on the surface of the substrate in the step (a) and a number of upper electrodes are arranged in parallel with each other so as to run in a direction perpendicular to the lower electrodes on the substrate in the step (e), the semiconductor device array can be driven sequentially (dynamic drive). It, is possible to use a single upper electrode without patterning so that it may operate as common electrode for all the semiconductor devices.

Finally, although not shown, a step as described below may be conducted after producing the upper electrode whenever necessary.

(Removal of Region of Second Ingredient or Oxide of Second Ingredient)

The region 37 of the second ingredient or oxide of the second ingredient that surrounds the semiconductor devices may be removed to expose the semiconductor devices 38. Solutions that can be used for this step are same as those listed for the step (c'-2) of expanding the pores. The condition including solution temperature, solution density, duration and so on in which the operation of removing the surrounding amorphous region, leaving only the semiconductor array main body of a crystalline semiconductor material and the electrodes, may be selected appropriately depending on the size of the prepared pores.

To summarily reiterate the above description on the present invention, the present invention provides a novel semiconductor device obtained by highly densely arranging nano-semiconductor devices in array that are prepared by using a porous thin film obtained by removing one of a plurality of ingredients of a nano-structure that show a eutectic relationship and also a method of manufacturing such a novel semiconductor device.

Now, the present invention will be described further by way of examples, although they do not limit the scope of the present invention by any means.

EXAMPLE 1

Figure 5A:
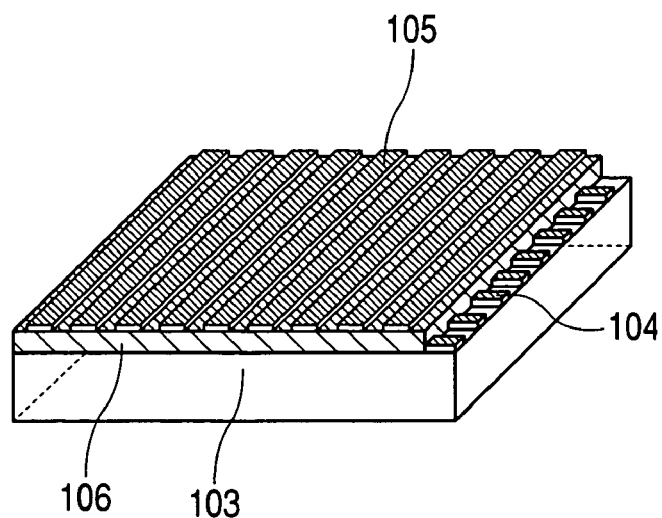
FIGS. 5A and 5B schematically illustrate a diode array prepared in Example 1.
Figure 5B:
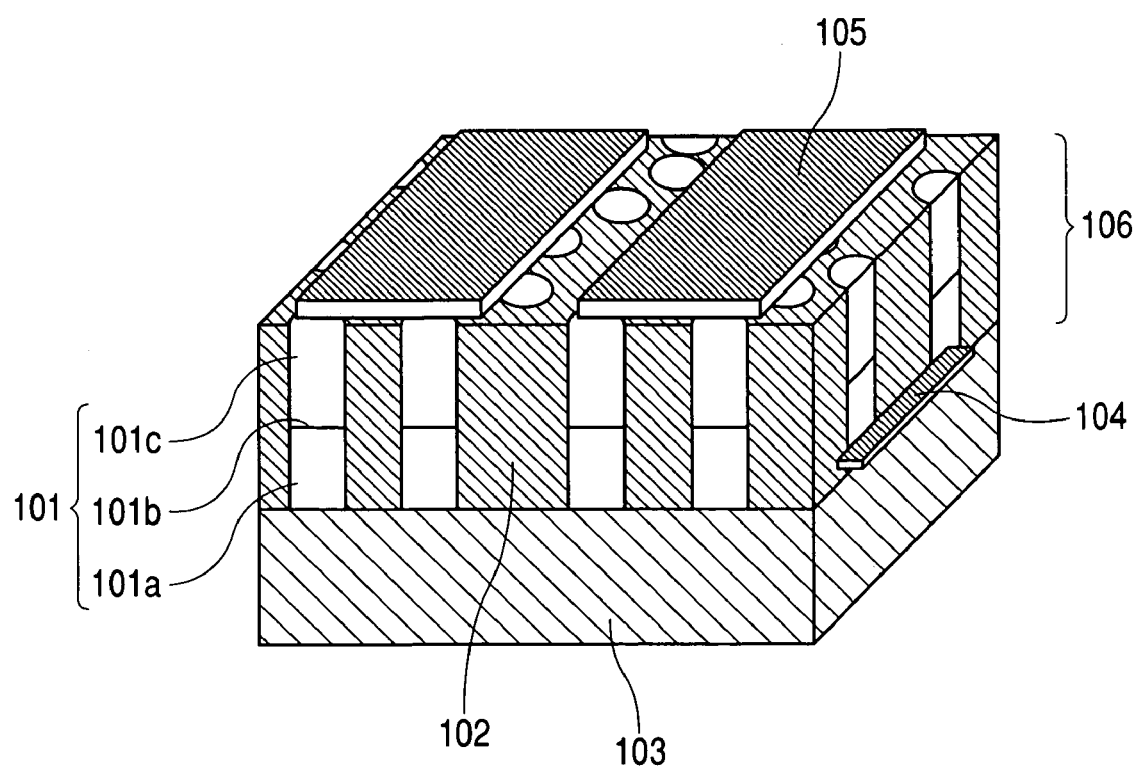

In this example, silicon diodes were prepared in a porous silicon oxide thin film. More specifically, a silicon diode array as schematically shown in FIGS. 5A and 5B was prepared. FIG. 5A is a schematic illustration of the entire array and FIG. 5B is an enlarged schematic illustration of a nano-sized part of the array of FIG. 5A. Reference symbol 106 denotes the thin film portion comprising an array of nano-sized diodes.

(Preparation of Lower Electrode)

Referring to FIG. 5A, a gold film was deposited on a 1.1 mm thick 2 cm square glass substrate 103 to a thickness of 200 nm by evaporation and subsequently subjected to a patterning operation, where the gold film was linearly etched by 10 μm in parallel with a side of the glass substrate at regular intervals of 100 μm so that strip-shaped metal electrodes 104 having a width of 90 μm were arranged at regular intervals.

(Preparation of Porous Silicon Oxide Thin Film)

Then, an aluminum/silicon mixture film 106 was formed on the glass substrate 103 to a thickness of 200 nm by magnetron sputtering. A target prepared by placing six 15 mm square silicon chips on a circular aluminum target having a diameter of 4 inches (101.6 mm) was used. The sputtering operation was conducted by using an RF power source under the condition of an Ar flow rate: 50 sccm, a discharge pressure: 0.7 Pa and a making power: 300 W. The substrate was held to room temperature (25° C.).

While a target prepared by placing six silicon chips 92 on an aluminum target 91 as shown in FIG. 9 was used, the number of silicon chips is by no means limited thereto. In other words, the number of silicon chips may vary depending on the sputtering condition and should be selected so as to produce a desired structure, which will be described hereinafter. Additionally, the target is not necessarily prepared by placing silicon chips on an aluminum target. For instance, a target prepared by placing aluminum chips on a silicon target or by sintering silicon and aluminum may alternatively be used.

When an upper part and a cross section of the aluminum/silicon mixture film were observed through an FE-SEM, it was found that cylinder-shaped aluminum structure parts were two-dimensionally arranged and surrounded by a silicon region. The cylinder-shaped aluminum structure parts had a diameter of 6 nm and adjacently located structure parts were separated by 8 nm in average when measured from center to center. The cylinder-shaped aluminum structure parts had a height of 200 nm and separated from each other by the silicon region.

The composition of the elements in the aluminum/silicon mixture film prepared in this example was analyzed by means of inductively coupled plasma emission spectrometry (ICP). Note that a specimen formed on a carbon substrate was used for the analysis. As a result, it was found that the ratio of the partial quantity of silicon relative to the total quantity of silicon and aluminum was 37 atomic %. In this way, an aluminum/silicon mixture film containing aluminum in the form of nano-pillars by 37 atomic % was prepared. When the specimen was observed by X-ray diffractometry, no diffraction peaks of silicon that show crystallinity of silicon were found to prove that the silicon of the specimen was amorphous. On the other hand, with respect to the aluminum a plurality of diffraction lines were found to prove that the aluminum of the specimen was crystalline.

The obtained aluminum/silicon mixture film containing silicon by 37 atomic % relative to the total quantity of aluminum and silicon was immersed in 5 wt % phosphoric acid for four hours to selectively etch only the cylinder-shaped aluminum structure parts and produce pores. As a result, a porous silicon film including nano-sized pores running perpendicularly relative to the film surface was formed.

Then, the porous silicon thin film obtained as a result of the etching operation, using phosphoric acid, was observed through an FE-SEM. When the surface was viewed from right above the substrate, it was found that pores were two dimensionally arranged and surrounded by a silicon region. The pores had a diameter of 6 nm and the average gap separating adjacently located pores was 8 nm. When a cross section of the specimen was observed through an FE-SEM, it was found that the pores had a length of 200 nm and were separated from each other by the silicon region and hence independent from each other.

Thereafter, the obtained porous silicon thin film was heated in an oxygen atmosphere. More specifically, it was heated at 800° C. for 2 hours, while oxygen was made to flow at a rate of 50 sccm under atmospheric pressure. As a result, silicon oxide was produced. The produced silicon oxide was confirmed by means of spatially resolved electron energy loss spectroscopy (EELS).

After the oxidation process, the porous thin film was observed through an FE-SEM. When the surface was viewed from right above the substrate, it was found that pores were two dimensionally arranged and surrounded by a silicon oxide region. The pores had a diameter of 5 nm and the average gap separating adjacently located pores was 8 nm. When a cross section of the specimen was observed through an FE-SEM, it was found that the pores had a length of 200 nm and were separated each other by the silicon oxide region and hence independent from each other.

Thus, a porous silicon oxide thin film was obtained.

The silicon content ratio in the silicon oxide region was determined by ICP. It was about 90 atomic % relative to the total quantity of all the elements except oxygen.

(Preparation of Silicon Diodes)

Gold particles were formed by electrodeposition on the gold electrodes at the bottom of the pores of the prepared porous silicon oxide thin film. A commercially available electroplating solution (available from Kojundo Kagaku Kenkyusho Co., Ltd., commodity code: K-24E) was used for the electrodeposition in an acidic bath (pH=4.5) held to 40° C. with a current density of 0.5 A/cm$^2$.

Subsequently, the porous silicon oxide thin film was placed in a quartz tube and, after reducing the internal pressure to a pressure level not higher than 13 Pa, heated to 440° C. while argon gas was made to flow there. Then, helium gas, to which silane gas was added to a content ratio of 10%, was supplied at a flow rate of 50 sccm for 60 seconds. In this operation, diborane was added to silane gas as dopant source for the former 30 seconds to make a lower part of the silicon oxide p-type (101*a*) and phosphine was added to silane gas as dopant source for the latter 30 seconds to make an upper part of the silicon oxide n-type (101*c*) so as to produce silicon pillars having a p-n junction 101*b* in the silicon in each of them, while the gold particles at the bottom of the pores were used as catalyst. The duration of this step was determined in a preliminary experiment that was conducted in advance. The porous silicon oxide thin film, into which silicon was introduced in the above step, was then polished at the surface thereof to remove the gold particles and the unnecessary silicon adhered. Thereafter, the obtained product was observed through an FE-SEM to find that silicon had been formed in the pores. When observed by X-ray diffractometry, diffraction lines attributable to crystalline silicon were found to prove that the introduced silicon of the pillars was crystalline.

Then, a gold film was formed to a thickness of 200 nm by sputtering on the top of the porous silicon oxide thin film containing silicon in the pores thereof that had been produced as a result of the above steps. Thereafter, 90 µm wide strip-shaped upper gold electrodes 105 were produced by patterning in such a way that the upper gold electrodes 105 run in a direction perpendicular to the gold electrodes at the bottom.

As a result of the above steps, a diode array, in which about $1.3 \times 10^8$ ($1.1 \times 10^4 \times 1.1 \times 10^4$) diodes share a same electrode as a group of diodes arranged within each region having a width of 90 µm, was produced.

(Confirmation of Rectifying Function)

Figure 6:
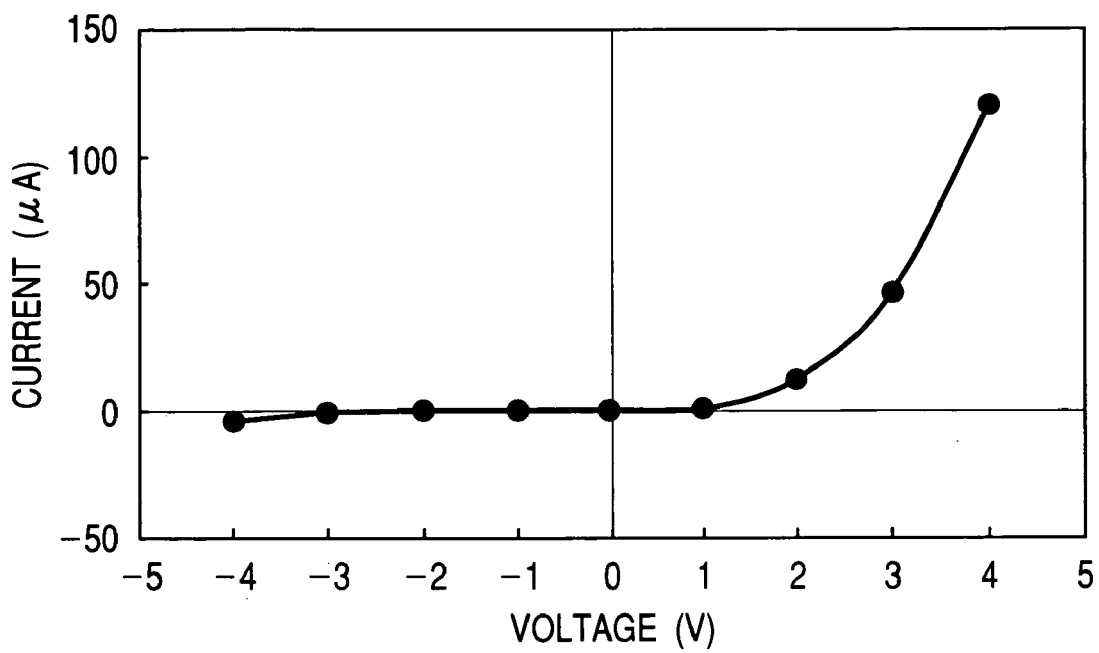
FIG. 6 is a graph illustrating the relationship between the voltage and the electric current of the diode prepared in Example 1.

After putting a mask on the product so that the silicon oxide may not be directly exposed to light, one of the lower electrodes 104 on the glass substrate 103 and one of the upper electrodes 105 on top of the porous silicon oxide thin film were selected and a variable voltage was applied thereto. Then, the electric current flowing between the selected electrodes was gauged. Several pairs of electrodes were selected and subjected to a similar test to find that all the selected pairs produced a substantially same result. FIG. 6 illustrates a typical result. Substantially no electric current flowed backwardly when an inverse voltage was applied, whereas an electric current started to flow forwardly when the applied voltage got to about 0.7V. Neither a leakage current nor dielectric destruction was observed to prove that the specimen had a rectifying function.

Thus, it was confirmed that a diode array comprising diodes that were arranged in a porous silicon oxide thin film and operated properly was prepared.

(Confirmation of Function of Photodiodes)

Figure 7:
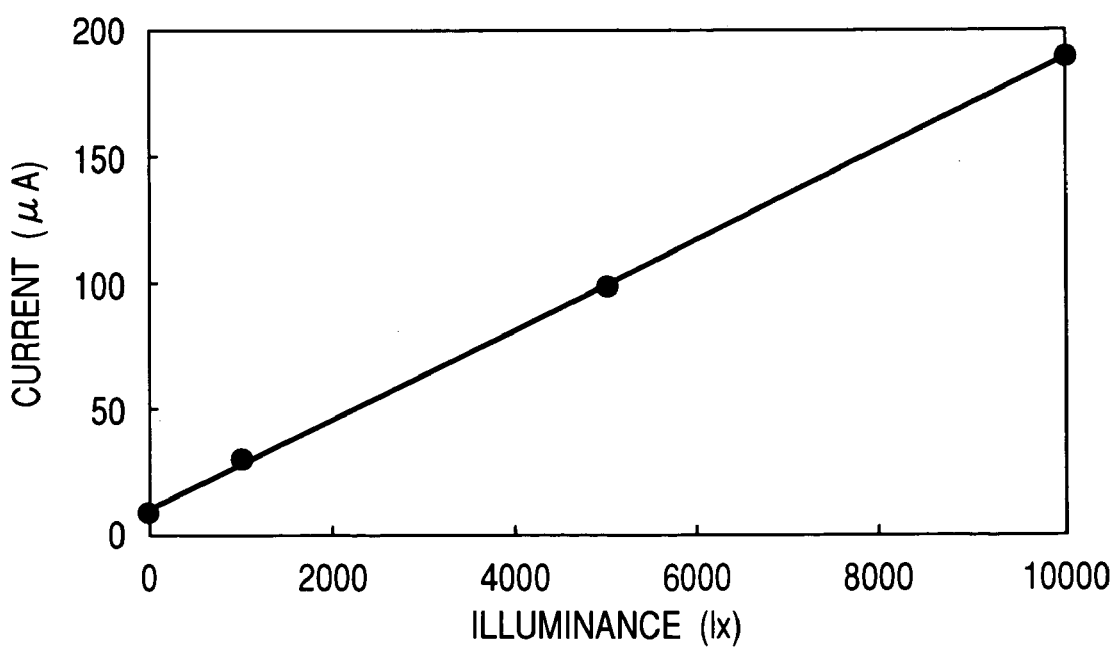
FIG. 7 is a graph illustrating the relationship between the luminance of irradiated light and the electric current of the diode prepared in Example 1.

One of the lower electrodes 104 on the glass substrate and one of the upper electrodes 105 on the top of the porous silicon oxide thin film were sequentially selected to form pairs, to each of which an inverse voltage of 10V was applied and the produced electric current was observed. Thereafter, the mask was peeled off and the electric current was observed again, irradiating light on the porous silicon oxide thin film stepwise with several different levels of illuminance. Several pairs of electrodes were selected and subjected to a similar test to find that all the selected pairs produced a substantially same result. FIG. 7 illustrates a typical result. The electric current increased in proportion to the illuminance of light to prove that the diodes operated as photodiodes.

Thus, it was confirmed that a diode array comprising diodes that were arranged in a porous silicon oxide thin film and adapted to operate as photodiodes was prepared.

EXAMPLE 2

In this example, the diodes were made to have an extended diameter. A porous silicon thin film having a pore structure similar was prepared as in Example 1.

Then, the structure was immersed in a 1 mol/L solution of sodium hydroxide held to 25° C. for 30 minutes in order to expand the pores.

After expanding the pore diameter, the porous silicon thin film was observed through an FE-SEM to find that the pores were arranged two-dimensionally and surrounded by a silicon region. When observed, the pores had a diameter of 6 nm and the average gap separating adjacently located pores was 8 nm. It was also found that the pores had a length of 200 nm and were separated each other by the silicon oxide region and hence independent from each other. When the specimen was observed by X-ray diffractometry, no silicon peaks that show crystallinity of silicon were found to prove that the silicon of the specimen was amorphous.

Thereafter, the porous silicon thin film was oxidized as in Example 1 to produce a porous silicon oxide thin film and silicon diodes were formed in the pores.

A voltage was applied to each of the selected pairs of electrodes of the semiconductor device and observed the electric current as in Example 1 to find that practically no electric current flowed when an inverse voltage is applied as in Example 1, whereas an electric current started to flow when a forward voltage of about 0.7V was applied. When a voltage of 4V was applied it was confirmed that a diode array of diodes whose electric current is greater than that of the diodes of Example 1 by about 50 µA had been prepared.

As a result of adding a step of expanding the diameter of the pores, it was possible to increase the electric current of the diodes.

EXAMPLE 3

In this example, silicon diodes were prepared by removing the porous silicon oxide thin film that had contained the silicon diodes.

A 0.3 mm thick 2 cm square gold plate was used in place of a glass substrate so as to make it operate also as lower electrode. The upper electrode was not subjected to patterning and hence a single upper electrode was used. Otherwise, the steps of Example 1 were followed to prepare a semiconductor device.

Then, the semiconductor device was dipped into a 2% solution of hydrofluoric acid and left there quietly for 1 minute. Then, it was taken out quietly from the solution and washed with distilled water. Thereafter, it was made to dry spontaneously. When observed through an FE-SEM, it was found that cylinder-shaped structure parts were neatly arranged between the upper electrode and the substrate.

A voltage was applied between the upper electrode and the substrate to see the electric characteristics of the specimen as in Example 1.

The obtained result was essentially same as that of Example 1 to prove that the electric characteristics of the diodes are not adversely affected when a process of removing the porous silicon oxide thin film was conducted.

Thus, a diode array whose surface was exposed was prepared.

EXAMPLE 4

In this example, silicon diodes were formed in a porous germanium oxide film.

A silicon diode array as schematically shown in FIGS. 5A and 5B were prepared by using a porous germanium oxide thin film in place of the porous silicon oxide thin film of Example 1.

(Preparation of Lower Electrode)

Referring to FIG. 5A, a gold film was deposited on a 1.1 mm thick 2 cm square glass substrate 103 to a thickness of 200 nm by evaporation and subsequently subjected to a patterning operation, where the gold film was linearly etched by 10 μm in parallel with a side of the glass substrate at regular intervals of 100 μm so that strip-shaped metal electrodes 104 having a width of 90 μm were arranged at regular intervals.

(Preparation of Porous Germanium Oxide Thin Film)

Then, an aluminum/germanium mixture film was formed on the glass substrate 103 to a thickness of 200 nm by magnetron sputtering. A target prepared by placing four 15 mm square germanium chips on a circular aluminum target having a diameter of 4 inches (101.6 mm) was used. The sputtering operation was conducted by using an RF power source under the condition of an Ar flow rate: 50 sccm, a discharge pressure: 0.7 Pa and a making power: 300 W. The substrate was held to room temperature (25° C.).

While a target prepared by placing four germanium chips on an aluminum target was used, the number of germanium chips is by no means limited thereto. In other words, the number of germanium chips may vary depending on the sputtering condition and should be selected so as to produce a desired structure, which will be described hereinafter. Additionally, the target is not necessarily prepared by placing germanium chips on an aluminum target. For instance, a target prepared by placing aluminum chips on a germanium target or by sintering germanium and aluminum may alternatively be used.

When an upper part and a cross section of the aluminum/germanium mixture film were observed through an FE-SEM, it was found that cylinder-shaped aluminum structure parts were two-dimensionally arranged and surrounded by a germanium region. The cylinder-shaped aluminum structure parts had a diameter of 12 nm and adjacently located structure parts were separated by 15 nm in average when measured from center to center. The cylinder-shaped aluminum structure parts had a height of 200 nm and separated from each other by the germanium region.

The composition of the elements in the aluminum/germanium mixture film prepared in this example was analyzed by means of inductively coupled plasma emission spectrometry (ICP). As a result, it was found that the ratio of the partial quantity of germanium relative to the total quantity of germanium and aluminum was 37 atomic %. In this way, an aluminum/germanium mixture film containing aluminum in the form of nano-pillars by 37 atomic % was prepared. When the specimen was observed by X-ray diffractometry, no diffraction peaks of germanium that show crystallinity of germanium were found to prove that the germanium of the specimen was amorphous. On the other hand, with respect to the aluminum a plurality of diffraction lines were found to prove that the aluminum of the specimen was crystalline.

The obtained aluminum/germanium mixture film containing germanium by 37 atomic % relative to the total quantity of aluminum and germanium was immersed in 5 wt % phosphoric acid for four hours to selectively etch only the cylinder-shaped aluminum structure parts and produce pores. As a result, a porous germanium film including nano-sized pores running perpendicularly relative to the film surface was formed.

Then, the porous germanium thin film obtained as a result of the etching operation, using phosphoric acid, was observed through an FE-SEM. When the surface was viewed from right above the substrate, it was found that pores were two dimensionally arranged and surrounded by a germanium region. The pores had a diameter of 12 nm and the average gap separating adjacently located pores was 15 nm. When a cross section of the specimen was observed through an FE-SEM, it was found that the pores had a length of 200 nm and were separated from each other by the germanium region and hence independent from each other.

Thereafter, the obtained porous germanium thin film was heated in an oxygen atmosphere. More specifically, it was heated at 800° C. for 2 hours, while oxygen was made to flow at a rate of 50 sccm under atmospheric pressure. As a result, germanium oxide was produced. The produced germanium oxide was confirmed by means of spatially resolved electron energy loss spectroscopy (EELS).

After the oxidation process, the porous thin film was observed through an FE-SEM. When the surface was viewed from right above the substrate, it was found that pores were two dimensionally arranged and surrounded by a germanium oxide region. The pores had a diameter of 11 nm and the average gap separating adjacently located pores was 15 nm. When a cross section of the specimen was observed through an FE-SEM, it was found that the pores had a length of 200 nm and were separated each other by the germanium oxide region and hence independent from each other.

Thus, a porous germanium oxide thin film was obtained.

The germanium content ratio in the germanium oxide region was determined by ICP. It was about 90 atomic % relative to the total quantity of all the elements except oxygen.

(Preparation of Silicon Diodes)

Gold particles are formed by electrodeposition on the gold electrodes at the bottom of the pores of the prepared porous germanium oxide thin film. A commercially available electroplating solution (available from Kojundo Kagaku Kenkyusho Co., Ltd., commodity code: K-24E) was used for the electrodeposition in an acidic bath (pH=4.5) held to 40° C. with a current density of 0.5 A/cm$^2$.

Subsequently, the porous germanium oxide thin film was placed in a quartz tube and, after reducing the internal pressure to a pressure level not higher than 13 Pa, heated to 440° C. while argon gas was made to flow there. Then, helium gas, to which silane gas was added to a content ratio of 10%, was supplied at a flow rate of 50 sccm for 60 seconds. In this operation, diborane was added to silane gas as dopant source for the former 30 seconds to make a lower part of the silicon oxide p-type (101a) and phosphine was added to silane gas as dopant source for the latter 30 seconds to make an upper part of the silicon oxide n-type (101c) so as to produce silicon pillars having a p-n junction 101b in the silicon in each of them, while the gold particles at the bottom of the pores were used as catalyst. The duration of this step was determined in a preliminary experiment that was conducted in advance. The porous germanium oxide thin film, into which silicon was introduced in the above step, was then polished at the surface thereof to remove the gold particles and the unnecessary silicon adherend. Thereafter, the obtained product was observed through an FE-SEM to find that silicon had been formed in the pores. When observed by X-ray diffractometry, diffraction lines attributable to crystalline silicon were found to prove that the introduced silicon diode of the pillars was crystalline.

Then, a gold film was formed to a thickness of 200 nm by sputtering on the top of the porous germanium oxide thin film containing silicon in the pores thereof that had been produced as a result of the above steps. Thereafter, 90 µm wide strip-shaped upper gold electrodes 105 were produced by patterning in such a way that the upper gold electrodes 105 run in a direction perpendicular to the gold electrodes at the bottom.

As a result of the above steps, a diode array, in which about $3.6 \times 10^7$ ($6.0 \times 10^3 \times 6.0 \times 10^3$) diodes shares a same electrode as a group of diodes arranged within each region having a side of 90 µm, was produced.

(Confirmation of Rectifying Function)

The electric current running through the obtained semiconductor device was observed by applying a voltage as in Example 1 to find that practically no electric current flowed when an inverse voltage was applied whereas an electric current started to flow forwardly when the applied voltage got to about 0.7V. When a voltage of 4V was applied, it was confirmed that a diode array of diodes whose electric current is greater than that of the diodes of Example 1 by about 40 µA had been prepared.

EXAMPLE 5

In this example, p-i-n type light-emitting diodes were formed in a porous silicon oxide thin film.

A porous silicon oxide thin film was prepared as in Example 1 except that gold was deposited by evaporation to a thickness of 200 nm on the entire surface of a substrate to form a lower electrode without any pattern operation.

Then, gold particles were formed on the bottom of the pores as in Example 1. Thereafter, the porous silicon oxide thin film was placed in a quartz tube, in which a target containing indium phosphide by 99% and zinc by 1% had been arranged at the focal position of an Nd-YAG laser (wavelength: 1064 nm, average 2.5 W) in advance. Then the porous silicon oxide film was heated to 800° C., while argon gas was made to flow there at a rate of 100 sccm under a pressure of $1.3 \times 10^4$ Pa, and a laser beam was irradiated onto the target for 10 seconds. Subsequently, a laser beam was irradiated onto a target containing indium phosphide by 100% for a second in the same condition. Thereafter, the target was replaced with one containing indium phosphide by 99% and tellurium by 1% and irradiated with a laser beam for 10 seconds in the same condition. The duration of each laser irradiation in this step was determined in a preliminary experiment that was conducted in advance. As a result of the above described step, pillars of indium phosphide, each having three layers including a layer of p-type indium phosphide formed by using zinc as dopant, a layer of indium phosphide formed without using any dopant and a layer of n-type indium phosphide formed by using tellurium as dopant that were arranged on the substrate in the above mentioned order, hence including a p-i-n junction, were produced by using the gold particles on the bottom of the pores as catalyst. The porous silicon oxide thin film was then polished at the surface thereof to remove the unnecessary indium phosphide adhered. Thereafter, the obtained product was observed through an FE-SEM to find that indium phosphide had been formed in the pores. When observed by X-ray diffractometry, diffraction lines attributable to crystalline indium phosphide were found to prove that the introduced indium phosphide of the pillars was crystalline.

Then, indium tin oxide (ITO) was deposited to a film thickness of 200 nm on the top of the produced porous silicon oxide thin film, which contained indium phosphide in the pores thereof, by means of sputtering to consequently cover the top of the thin film with a transparent electrode.

When a forward voltage of 2V was applied between the upper and lower electrodes of the diode array, it was found that infrared rays were emitted from the entire surface of the porous silicon thin film with a wavelength of about 800 nm.

As a result, it was confirmed that there had been produced a light-emitting diode array containing p-i-n type indium phosphide diodes in the porous silicon oxide film that operated as light-emitting diodes.

EXAMPLE 6

In this example, phototransistors were formed in a porous silicon oxide thin film.

A porous silicon oxide thin film was prepared as in Example 1 and then p-n-p type silicon transistors, each having two p-n junctions, were formed in the pores of the thin film. The technique used in Examples 1 through 4 for forming p-type silicon and n-type silicon was also used in this example. Thereafter, the obtained product was observed through an FE-SEM to find that silicon had been formed in the pores as in Examples 1 through 4. When observed by X-ray diffractometry, diffraction lines attributable to crystalline silicon were found to prove that the introduced silicon of the pillars was crystalline.

Then, indium tin oxide (ITO) was deposited to a film thickness of 200 nm on the top of the produced porous silicon oxide thin film, which contained silicon in the pores thereof, by means of sputtering to form a transparent electrode, which was then subjected to a patterning operation to produce 90 µm wide strip-shaped upper electrodes 105 running in a direction perpendicular to the direction of the gold electrodes at the bottom.

As a result of the above steps, a transistor array, in which about $3.6 \times 10^7$ ($6.0 \times 10^3 \times 6.0 \times 10^3$) transistors share a same electrode as a group of transistors arranged within each region having a side of 90 µm, was produced.

Figure 8:
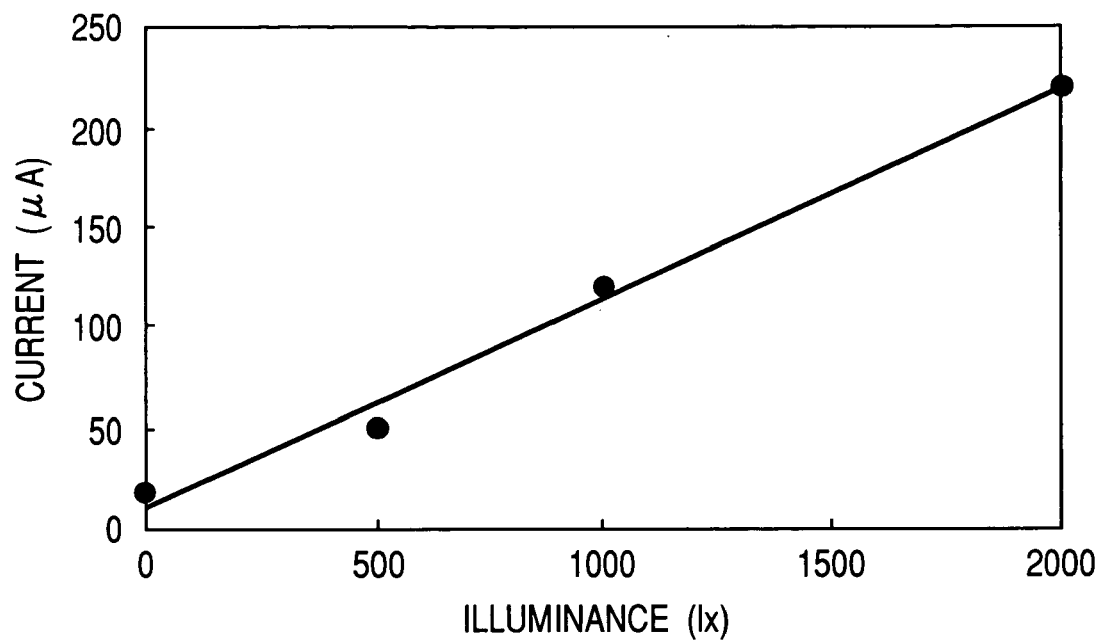
FIG. 8 is a graph illustrating the relationship between the luminance of irradiated light and the electric current of the phototransistor prepared in Example 6.

A shade mask was put on the porous silicon oxide thin film and 10V was applied sequentially to each of the pairs of selected upper and lower electrodes to gauge the electric current that flowed between the electrodes as in Example 1. Thereafter, the mask was peeled off and the electric current was observed again, irradiating light on the porous silicon oxide thin film stepwise with several different levels of illuminance to find that all the selected pairs produced a substantially same result. FIG. 8 illustrates a typical result. The electric current increased in proportion to the illuminance of light. Additionally, the electric current was larger than the corresponding electric current in Example 1.

Thus, it was confirmed that a phototransistor array comprising transistors that were arranged in a porous silicon oxide thin film and adapted to operate as phototransistor was prepared.

As described above in detail, according to the invention, it is possible to prepare in a simple manner a semiconductor device array comprising highly densely arranged nano-sized semiconductor devices by introducing a semiconductor material into the pores produced from a thin film that includes nano-pillars and is made of materials that can form a eutectic crystal with each other.

What is claimed is:

1. A method of manufacturing a semiconductor device comprising:
   a step of preparing a structure including a plurality of cylinder-shaped members and a region surrounding the cylinder-shaped members;
   a step of forming a porous body having cylinder-shaped pores by removing the cylinder-shaped members from the structure; and
   a step of introducing a material into the pores of the porous body and forming p-n or p-i-n junctions.

2. A method according to claim 1, wherein said cylinder-shaped members formed so as to contain a first material are surrounded by said region formed so as to contain a second material in said structure and the structure contains the second material at a ratio of not smaller than 20 atomic % and not greater than 70 atomic % relative to the total quantity of the first and second materials.

3. A method of manufacturing a semiconductor device array comprising:
   (a) a step of arranging an electrode on a substrate;
   (b) a step of forming a structure including a matrix member containing a second ingredient capable of forming a eutectic crystal with a first ingredient and cylinder-shaped regions containing the first ingredient and dispersed in the matrix member on said substrate;
   (c) a step of removing said cylinder-shaped regions;
   (d) a step of forming semiconductor regions, each having at least a p-n junction or a p-i-n junction, in the cylinder-shaped pores obtained as a result of the above removing step;
   (e) a step of forming another electrode on the top of said structure in which said semiconductor regions are formed.

4. A method according to claim 3, wherein etching is used for said removing step.

5. A method according to claim 3, further comprising a step of chemically treating the matrix member containing said second ingredient after the step of removing said cylinder-shaped regions.

6. A method according to claim 5, wherein said chemical treatment is oxidation.

7. A method according to claim 3, further comprising a step of increasing the pore diameter of the cylinder-shaped pores after the step of removing said cylinder-shaped regions.

8. A method according to claim 3, further comprising a step of removing said matrix member surrounding said cylinder-shaped regions after the step of forming another electrode on the top of said structure.

9. A method according to claim 3, wherein a chemical vapor deposition method is used for said step of forming semiconductor regions.

10. A method according to claim 3, wherein said step of forming semiconductor regions is performed by means of a catalytic reaction after forming a catalyst at the bottoms of said pores.

* * * * *

UNITED STATES PATENT AND TRADEMARK OFFICE
CERTIFICATE OF CORRECTION

PATENT NO. : 7,183,127 B2
APPLICATION NO. : 10/735062
DATED : February 27, 2007
INVENTOR(S) : Kuriyama et al.

It is certified that error appears in the above-identified patent and that said Letters Patent is hereby corrected as shown below:

On the Title Page:

Item "[73] Assignee:", change "Canon Kabushiki Kasha, Tokyo (JP)" to

--Canon Kabushiki Kaisha, Tokyo (JP)--; and

In Column 7, Line 51, change "mm" to --mm-squared--.

Signed and Sealed this

Fourteenth Day of October, 2008

JON W. DUDAS
*Director of the United States Patent and Trademark Office*